United States Patent [19]
Bayan et al.

[11] Patent Number: 5,146,310
[45] Date of Patent: Sep. 8, 1992

[54] THERMALLY ENHANCED LEADFRAME

[75] Inventors: Jaime A. Bayan; Jeffrey C. Demmin, both of Palo Alto; Mark L. DiOrio, Cupertino; Young I. Kwon, Santa Clara, all of Calif.

[73] Assignee: National Semiconductor Corp., Santa Clara, Calif.

[21] Appl. No.: 731,970

[22] Filed: Jul. 18, 1991

Related U.S. Application Data

[63] Continuation of Ser. No. 422,344, Oct. 16, 1989, abandoned.

[51] Int. Cl.[5] .................... H01L 23/34; H01L 23/36; H01L 23/12
[52] U.S. Cl. ......................................... 357/70; 357/81
[58] Field of Search .................... 357/70, 81; 174/52.4

[56] References Cited

U.S. PATENT DOCUMENTS 4,809,053 2/1989 Kuriashi ................. 357/70

FOREIGN PATENT DOCUMENTS 0086724 8/1983 European Pat. Off. ............. 357/70
0082168 7/1978 Japan ................................. 357/70
0053752 3/1986 Japan ................................. 357/70

Primary Examiner—Rolf Hille
Assistant Examiner—S. V. Clark
Attorney, Agent, or Firm—Skjerven, Morrill, MacPherson, Franklin & Friel

[57] ABSTRACT

A thermally enhanced leadframe having heat conductive paths which thermally couple a die attach pad to thermal connection points spread out as far as possible from each other on the perimeter of the package. The area of the heat conductive path is maximized to occupy substantially all area in the package not occupied by the electrically conductive paths between the wire bond locations and the external connection points such as pins. This configuration maximizes the area of the printed circuit board which is heated thereby increasing thermal cooling efficiency. Further, the leadframe configuration maximizes the area of contact between the integrated circuit package and the heat conductive path thereby increasing the thermal conductivity between the device junctions on the integrated circuit die and the ambient through the material of the package itself.

6 Claims, 1 Drawing Sheet

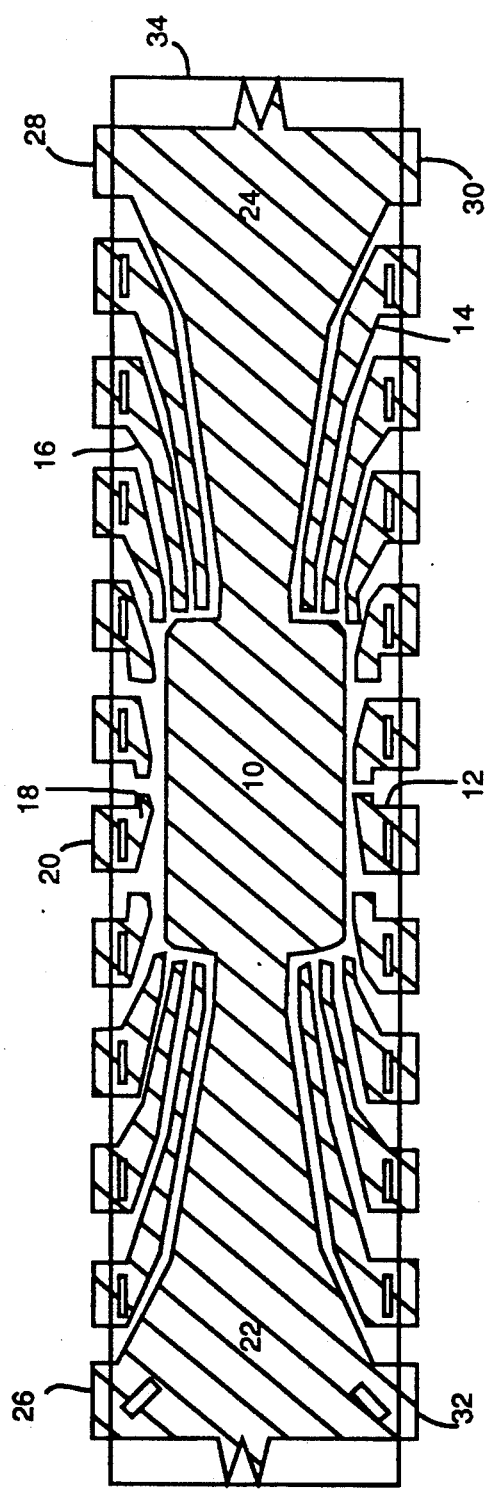
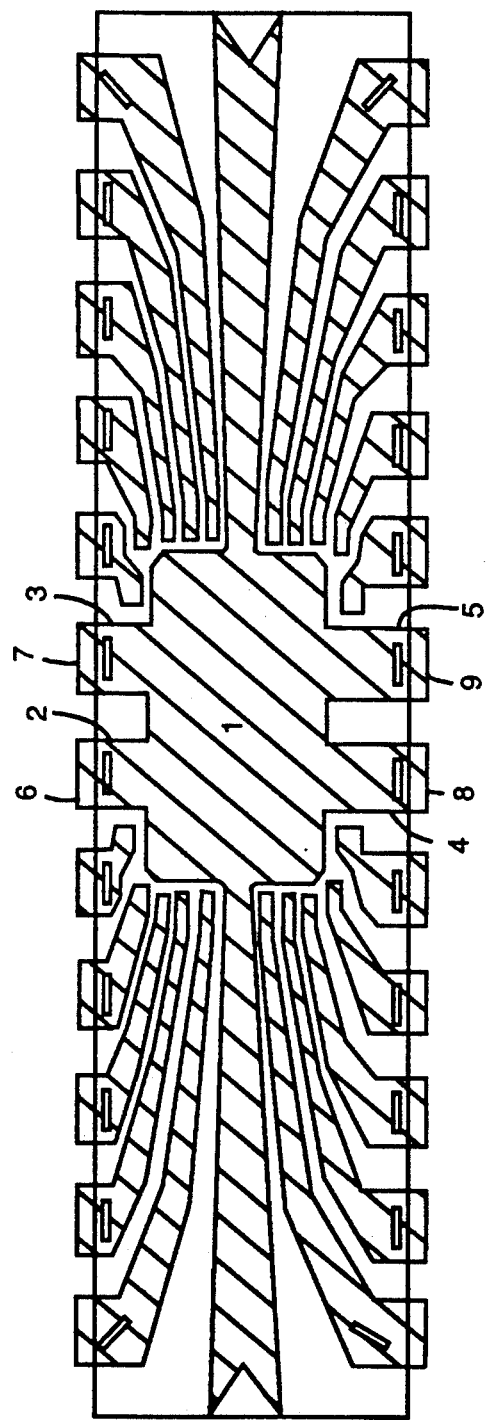
FIG. 1
FIG. 2
(PRIOR ART)

THERMALLY ENHANCED LEADFRAME

This application is a continuation of application Ser. No. 07/422,344, filed Oct. 16, 1989, abandoned.

BACKGROUND OF THE INVENTION

The invention pertains to the field of lead-frames for attachment to an integrated circuit device (sometimes hereafter also referred to as "die" or "integrated circuit die"). More particularly, the invention pertains to leadframes for high power integrated circuit applications such as high power linear operational amplifier circuits wherein the design of the leadframe is enhanced to improve the thermal performance of the integrated circuit die.

Cooling of integrated circuit die is often an important requirement, especially in high power applications. Heating of an integrated circuit die through internal power dissipation in the circuit elements formed thereon causes several deleterious effects. First, heating of the die can adversely affect the electrical characteristics of semiconductor junctions formed in transistors and diodes. Excessive junction temperature can cause changes in key electrical parameters, and can cause thermal runaway if not properly compensated. Further, differences in the coefficients of thermal expansion between aluminum, silicon, polysilicon, and oxide passivation layers and the plastic encapsulant material of the package, can lead to cracking of passivation layers thereby creating paths through which water vapor and other impurities may penetrate from the outside of the die to the underlying circuit structures. Water vapor in contact with aluminum can cause corrosion.

The principal mechanism by which integrated circuit die are cooled is conduction to the outside world through the leadframe. A leadframe is a metallic structure which supports the integrated circuit die and provides conductive paths from the connection pads on the integrated circuit die to pins which are used to make connections to external elements such as integrated circuit sockets or printed circuit boards.

One such leadframe which has been in use for several years by National Semiconductor Corporation, the assignee of the present invention, is called the "Batwing" leadframe. This design is shown in the FIG. 2 and is prior art. The principal paths of heat conduction away from the integrated circuit die attach pad 1 are the four shortest rectangular paths 2, 3, 4 and 5 leading from the die attach pad to four external pins at 6, 7, 8 and 9 which are normally connected by conductive paths (not shown) to a ground plane (not shown) on a printed circuit board (also not shown).

The "batwing" leadframe design provides acceptable cooling efficiency. However, as line widths decrease and it is possible to pack more and more power generating elements on a single integrated circuit die, there continues to be a need for improved heat dissipation capabilities for leadframes.

SUMMARY OF THE INVENTION

According to the teachings of the invention, there is disclosed a leadframe for an integrated circuit package which maximizes the area of a printed circuit board or other supporting structure into which heat conducted away from the integrated circuit die is coupled. This is done by using heat conductive paths which are thermally coupled to the sides of a die attach pad and which fan out to pin positions located at the corners of four-sided packages.

In one of the cooling mechanisms provided by this thermally enhanced design, heat from the integrated circuit die is thermally coupled to the die attach pad and from the die attach pad to the four corner connection points. Typically, these connection points are pins which pass through holes in a printed circuit board and make connections to ground conductors printed on the face of the board in metal. These ground conductors generally are routed to a ground plane metal conductor formed on the edge of the printed circuit board. The heat conducted along the heat path from the die attach pad to the four corner pins is coupled into the printed circuit board at the four corners of a package thereby defining an area on the surface of the printed circuit board or other support structure which is substantially as large or larger than the area of the package itself. This area is heated by a thermal coupling to the four corner pins. Heat from this area is coupled to the ambient by both radiation and convection but principally by convective cooling.

Another cooling mechanism is heat conducted along the ground conductor paths (where such ground conductor paths are present) to the ground plane. Further radiation and convective cooling occurs along these ground conductor paths and at the ground plane.

The area of the heat conduction paths in the leadframe leading away from the die attach pad increases at points further away from die attach pad. The configuration of the heat conduction paths is selected so as to consume substantially all the cross-sectional area defined by the perimeter of the package not consumed by electrical connection paths from the pin locations on the periphery of the package to wire bond locations adjacent to the die attach pad. This configuration for the heat conduction paths maximizes the area of thermal contact between the heat conduction paths and the material of the integrated circuit package which, typically, is plastic in the preferred embodiment. This creates another cooling mechanism by virtue of thermal coupling between the heat conduction paths and the plastic of the package. Heat coupled into the plastic of the package by this mechanism is coupled to the ambient by radiation and convection.

The advantages of the above described structure are multiple. First, cooling efficiency is increased thereby enhancing the reliability of the final product. For example, the measure of thermal efficiency in cooling of an integrated circuit die is a unit of measure which indicates the thermal efficiency of the cooling path from the junctions of active devices on the die to the ambient measured in degrees centigrade cooling per watt of power dissipation. For a standard 24 lead "skinny DIP", the measure of cooling efficiency is 59.2. For the prior art package of FIG. 2 without connection to a heat sink on the printed circuit board, cooling efficiency is 52,7. With a heat sink on the board to which the pins at 6, 7, 8 and 9 are connected, cooling efficiency improves to 42.9. The leadframe design of FIG. 1 without connection to a heat sink on the printed circuit board according to simulation has a cooling efficiency of 42. With connection of the pins at the corners 26, 28, 30 and 32 to a heat sink on the board, according to simulation cooling efficiency improves to 34.2, an almost twofold improvement over the standard package.

A problem with plastic integrated circuit packages is delamination caused by the differences in thermal expansion between the metal and plastic components of the package. One significant advantage of the leadframe according to the teachings of the invention is that the path for moisture to diffuse to the location of the die, if delamination should occur, is much longer. It is anticipated that this will lead to a greater mean-time-before-failure in reliability tests. Further, the degree of delamination, if any, is less because of the greater cooling efficiency. The greater cooling efficiency also means that greater numbers of high power devices may be placed on a single integrated circuit die without causing failure or degradation of other electrical characteristics caused by excessive heating of the integrated circuit die. Finally, the increased size of the heat conduction paths, which typically are connected to ground, means that the parasitic inductance of electrical connection leads is decreased. This is especially true for the electrical paths closest to the heat conduction path because the electrical and magnetic field lines between the electrical connection paths and the heat conduction/ground plane paths are shorter.

BRIEF DESCRIPTION OF THE DRAWINGS

FIG. 1 is a plan view of the leadframe according to the preferred embodiment of the invention.

FIG. 2 is a plan view of a leadframe known in the prior art.

DETAILED OF THE DESCRIPTION OF THE PREFERRED EMBODIMENT

Referring to FIG. 1, there is shown a plan view of the leadframe according to the preferred embodiment of the teachings of the invention. The leadframe is composed of a die attach pad 10, which is surrounded by a plurality of electrically conductive paths of which paths 12, 14 and 16 are typical. These paths are typically formed of metal. Each electrically conductive path leads from a wire bond attach point, such as the point 18, adjacent to the die attach pad 10 to an external connection point, of which the point 20 is typical. In the preferred embodiment, the external connection point is a metal pin which may be inserted into an integrated circuit socket soldered to a printed circuit board or which may be passed through a hole in the printed circuit board and soldered to an electrically conductive path printed on the opposite face of the printed circuit board. In other embodiments of the invention, for use with surface mount packages, the external connection points, such as the point 20, may be metallic pads on the edge of the package.

The die attach pad 10 is typically metal which has a high electrical and thermal conductivity. An integrated circuit die (not shown) is bonded to the die attach pad 10. The integrated circuit die has metallic pads formed on the edges thereof for wire bonding purposes. Each pad is connected to a particular node in the circuit formed on the die Each pad is then connected to a particular wire bond position, such as the wire bond position 18, by a gold wire which is wire bonded to the wire bond position and to the corresponding pad on the integrated circuit die. In most embodiments, the integrated circuit die also has a ground connection pad which is wire bonded to the die attach pad thereby making the die attach pad 10 the ground conductor for the integrated circuit.

The improvement to the thermal and reliability performance figures for the leadframe of FIG. 1 results from the configuration of two heat conduction paths 22 and 24. Typically, these heat conduction paths are metal and form extensions of the die attach pad 10. The purpose of these heat conduction paths 22 and 24 is to conduct heat which has been thermally coupled from the integrated circuit die to the die attach pad 10 out to four thermal connection points 26, 28, 30 and 32. These thermal connection points are located at the four corners of a rectangular integrated circuit package in the preferred embodiment, the outline of which is shown at 34. Note that the thermal connection points 26, 28, 30 and 32 are located on the perimeter of the integrated circuit package 34 substantially as far apart as possible. Note also, that the locus of the area defined by the thermal connection points 26, 28, 30 and 32, is substantially as large as the area of the integrated circuit package 34 itself. By conducting heat from the die attach pad 10 to the thermal connection points 26, 28, 30 and 32, the heat conduction paths 22 and 24 essentially spread out the heat to a larger area of the underlying printed circuit board or other supporting structure (not shown) to which the thermal connection points are thermally coupled. This creates a "radiator" area, i.e., an area from which heat is coupled to the ambient by radiation and convective cooling, on the underlying supporting structure.

Typically, the thermal connection points 26, 28, 30 and 32 are pins which pass through holes in a printed circuit board. These pins are typically soldered to ground connectors formed of metal printed on the opposite surface of the printed circuit board. These ground connectors are routed to and electrically connected to a ground plane which is typically formed on the edge of the printed circuit board. The heat conducted along the heat conduction paths 22 and 24 cause heating of the thermal connection pins 26, 28, 30 and 32. As noted above, these heated pins are thermally coupled to the printed circuit board phenolic and the metal of the ground connection paths. This heat is conducted in all directions through the material of the printed circuit board slowly until an area of the printed circuit board which is substantially as large or larger than the area of the integrated circuit package 34 itself is heated. Generally speaking, an area of the printed circuit board material which is larger than the integrated circuit package 34 is heated, because the heat from the pins 26, 28, 30 and 32 travels in all directions from the position of each of these thermal connection pins. Therefore, the effective radiator area through which heat is dissipated to the ambient is actually larger than the area of the integrated circuit package itself. This is a principal cooling mechanism made possible by the configuration of the heat conduction paths 22 and 24 and leads to a marked increase in thermal cooling efficiency for the leadframe according to the teachings of the invention.

The teachings of the invention are applicable to all sorts of package designs including squares, circles, triangles etc. To implement the teachings of the invention, it is only necessary to substantially spread out on the perimeter of the package the connections between the heat conducting paths and the underlying printed circuit board and conductive paths thereon. It is preferred to spread out these connection points as far as possible, but this is not absolutely critical since improved cooling efficiency results if the connection points of the heat conduction paths are simply spread out along the perimeter farther than in prior art designs.

A further mechanism for cooling of the integrated circuit die results from the widening configuration of the heat conduction paths 22 and 24 at points farther away from the die attach pad. This enhances a cooling path for radiation and convection cooling to the ambient through the plastic material of the package itself. To best understand this mechanism as well as how the cooling through the printed circuit board compares to the prior art, reference is made to FIG. 2.

FIG. 2 shows a prior art leadframe which has been used for high powered linear applications by the assignee of the present invention. In this prior art leadframe, the principal path of heat flow to the ambient is through four short heat paths 2, 3, 4 and 5. Note that the area of these heat conduction paths is much smaller than the area of the heat conduction paths 22 and 24. The heat conduction paths 2, 3, 4 and 5 typically terminate in pins at 6, 7, 8 and 9 which pass through the printed circuit board and are soldered to ground connection conductors formed on the opposite surface of the printed circuit board. Note also that the area defined by the locus of these four pins at the periphery of the package coupled to heat conduction paths 34, 36, 38 and 40 is a much smaller area than the area defined by the locus of the pins coupled to the thermal connection points 26, 28, 30 and 32 in the embodiment of FIG. 1.

To understand the significance of these different areas, reference is made to Equation 1 below. Equation 1 defines the thermal resistance of a thermal path between two points. Thermal resistance R is equal to $$R = \frac{L}{KA} \quad (1)$$

where
L = length of the thermal path between the two points in question,
K = a coefficient of thermal conductivity of the material through which heat is flowing along the path, and
A = the cross-sectional area of the material through which the heat flows.

Applying Equation 1 to the configuration for the leadframe of FIG. 1 versus the configuration for the leadframe of FIG. 2, the following observations may be made. First, consider the thermal path between the area of the printed circuit board heated by the pins at the thermal connection points 26, 28, 30 and 32 and the ambient for the embodiment of FIG. 1 versus the thermal path between the ambient and the area of the printed circuit board heated by the pins at thermal connection points 6, 7, 8 and 9 in the prior art embodiment of FIG. 2. From Equation 1, it is apparent that because the "radiator" area generated by the leadframe configuration of FIG. 1 is much larger than the "radiator" area for the prior art leadframe of FIG. 2, therefore the thermal resistance between the printed circuit board and the ambient for the leadframe according to the teachings of the invention is substantially less than the thermal resistance from the printed circuit board to the ambient for the prior art leadframe of FIG. 2. This translates to greater cooling efficiency in that more heat can be coupled to the ambient per unit of time for the leadframe according to the teachings of the invention than for the prior art leadframe.

Those skilled in the art will appreciate that the thermal path of interest in integrated circuit cooling is the thermal path between the integrated circuit die and the ambient. This thermal path is comprised of a number of subpaths. For example, in FIG. 1, there is a subpath from each junction on the die to the die attach pad 10. There is also a subpath from each junction through the packaging material to the ambient. There is also a subpath from the die attach pad along the heat conduction paths 22 and 24 to the pins at 26, 28, 30 and 32. There is also a subpath from the heat conduction paths 22 and 24 through the packaging material to the ambient. Another subpath is from the pins to the heat sink on the printed circuit board through a metal conduct- or formed on the printed circuit board. Finally, there are subpaths from the pins 26, 28, 30 and 32 to the printed circuit board material itself and from there to the ambient as well as the subpath from the heat sink to the ambient. Study of the configuration of the heat conduction paths 22 and 24 versus the heat conduction paths 34, 36, 38 and 40 in the prior art embodiment of FIG. 2 shows that, in the case of the leadframe shown in FIG. 1, the path length through heat conduction paths 22 and 24 from the die attach pad to the thermal connection pins 26, 28, 30 and 32 is longer than the path length in the prior art embodiment of FIG. 2 between the die attach pad and the thermal connection pins at 6, 7, 8 and 9. However, the cross-sectional area through which the heat travels in the case of the heat conduction paths 22 and 24 is larger than in the case of the heat conduction paths 2, 3, 4 and 5. This is because the heat conduction paths 22 and 24 increase in area at points further removed toward the corners of the package from the die attach pad 10. This increasing cross-sectional area tends to counterbalance the increased path length for the heat conduction paths 22 and 24. This counterbalancing effect coupled with the increased area of the printed circuit board which is heated by the thermal connection points at 26, 28, 30 and 32 leads to an overall increase in cooling efficiency from 42.9 for the leadframe of FIG. 2 to the comparably connected leadframe design of FIG. 1. This improved cooling efficiency is most likely caused by the improvements in the cross-sectional area of two subpaths. The first of these subpaths is the path from the heat conducting paths 22 and 24 to the ambient through the package material. This path has a larger cross-sectional area by virtue of the increased cross-sectional area of the heat conducting paths 22 and 24 relative the area of the paths 2, 3, 4 and 5 in the leadframe of FIG. 2.

The other improved subpath is the path from the pins 26, 28, 30 and 32 to the ambient through the material of the printed circuit board itself. Because the location of the pins at 26, 28, 30 and 32 is substantially spread out, the "radiator" area of the printed circuit board is larger. The larger area of these two subpaths means the thermal resistance is less in the case of the leadframe according to the teachings of the invention than the leadframe having the prior art configuration since the area term in the denominator of the thermal resistance equation, i.e., Equation (1) above, is larger. The overall cooling efficiency is thus substantially improved for the lead-frame of FIG. 1 versus the prior art leadframe of FIG. 2.

Another advantage which results from the configuration of the heat conduction paths 22 and 24 in FIG. 1 is improved package reliability. A problem with plastic integrated circuit packages results from delamination caused by differential coefficients of thermal expansion between the metal of the leadframe and the plastic of the package. Delamination is essentially a separation between the plastic of the package and the metal of the leadframe. When the package heats up during use, the differential rates of expansion cause the plastic to expand more than the metal of the leadframe. This causes separation between the metal of the leadframe and the plastic molded around the leadframe thereby creating narrow passageways through which water vapor and other impurities can diffuse. The existence of water vapor inside the package of an integrated circuit can cause corrosion of the aluminum used for the formation of conductive lines and contact pads on the integrated circuit die and can cause corrosion of aluminum elsewhere wherever it is exposed to the water vapor. This corrosion can cause physical failure of the electrically conductive path and/or increases in electrical resistance of the path.

It is anticipated that the leadframe configuration according to the teachings of the invention will yield greater package reliability in longevity tests. This improved reliability will most likely result from the anticipated greater resistance to penetration of water vapor into the package by diffusion along delamination paths. These delamination paths result from differences in thermal expansion which should be lessened if efficiency is improved. Further, the path length of delamination gaps through which water vapor can diffuse is increased for the leadframe configuration according to the teachings of the invention versus the prior art leadframe configuration. The longer diffusion length should lead to greater mean-time-before-failure test results in reliability testing. That is, in the prior art leadframe configuration shown in FIG. 2, the pathways for water vapor diffusion along the heat conductive paths 2, 3, 4 and 5 are much shorter than any delamination paths which might develop along the interface between the heat conduction paths 22 and 24 and the plastic of the package. This longer path length translates into a longer diffusion time between the time water vapor or other impurities begin diffusing through a delamination gap exposed to the ambient and the time that the water vapor or impurity reaches the integrated circuit die and starts the corrosion process. This should increase the mean-timebefore-failure.

A beneficial side effect of the lead frame configuration according to the teachings of the invention is reduced parasitic inductance for many of the electrically conductive paths because of the configuration of the conductive paths 22 and 24. The reason for this is that shorter electric and magnetic field lines exist between the electrically conductive paths and the heat conductive paths/ground plane paths 22 and 24.

Although the invention has been described in terms of the preferred embodiment disclosed herein, those skilled in the art will appreciate other embodiments which do not depart from the spirit and scope of the invention. For example, the teachings of the invention can be equally applied on square packages or packages with other configurations. To obtain the benefits of the invention, any configuration which spreads out the thermal connection points substantially or as far as possible on the perimeter of the integrated circuit package and which substantially maximizes the area of the heat conductive path which is in contact with the packaging material will suffice.

What is claimed is:

1. A leadframe for an integrated circuit package comprising:
   a die attach pad;
   a plurality of electrically conductive paths leading from wire bond attach pads located adjacent said die attach pad to external connection points; and
   at least two heat conduction paths which make thermal contact with said die attach pad, said heat conduction paths leading from said die attach pad to thermal connection points for thermal connection to an external support structure;
   wherein said package is four sided and wherein said thermal connection points are located at or near the corners of said package.

2. The apparatus of claim 1 wherein said heat conduction paths are also electrically conductive and serve also as ground connection paths.

3. The apparatus of claim 1 wherein said heat conduction paths and said electrically conductive paths are terminated in pins by which said package may be electrically and thermally coupled to said support structure.

4. A leadframe for an integrated circuit package, said package having a cross-sectional area defined by a perimeter, comprising:
   a die attach pad;
   a support structure for said integrated circuit package;
   means for making electrical connections between an integrated circuit die attached to said die attach pad and conductive paths formed on said support structure;
   means coupled to said die attach pad for conducting heat from said integrated circuit die to a plurality of points on said support structure, wherein said points define an area on said support structure which is at least substantially as large as the area of said package.

5. The apparatus of claim 4 wherein said means for conducting heat includes means for maximizing the area of heat conduction between said means for conducting and the electrically insulating material of said package.

6. The apparatus of claim 5 wherein said means for conducting heat is a metallic path forming an extension of said die attach pad on at least two edges, said metallic path expanding in area at points further away from said die attach pad so as to maximize the area of contact between said metallic path and the material of said package, said metallic path increasing in area so as to occupy substantially all said cross-sectional area defined by said perimeter not occupied by said means for electrical connection and so as to make contact with a plurality of thermal contact points for thermal connection to said support structure, said thermal contact points defining an area of said support structure substantially as large as the area of said package and heating an area of said support structure which is larger than said cross-sectional area defined by said perimeter.

* * * * *